(12) United States Patent
Oh et al.

(10) Patent No.: US 6,959,856 B2
(45) Date of Patent: Nov. 1, 2005

(54) SOLDER BUMP STRUCTURE AND METHOD FOR FORMING A SOLDER BUMP

(75) Inventors: Se-yong Oh, Hwasung (KR); Nam-seog Kim, Cheonan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 57 days.

(21) Appl. No.: 10/339,456

(22) Filed: Jan. 10, 2003

(65) Prior Publication Data

US 2004/0134974 A1 Jul. 15, 2004

(51) Int. Cl.⁷ .............................................. B23K 31/02
(52) U.S. Cl. .................................. 228/245; 228/180.22
(58) Field of Search .......................... 228/165, 180.21, 228/248.1, 245, 180.22, 180.1; 29/846; 361/768, 770; 438/613–617; 257/737, 738

(56) References Cited

U.S. PATENT DOCUMENTS

| | | | |
|---|---|---|---|
| 5,185,073 A | | 2/1993 | Bindra et al. |
| 5,674,326 A | | 10/1997 | Wrezel et al. |
| 5,759,046 A | | 6/1998 | Ingraham et al. |
| 5,813,870 A | * | 9/1998 | Gaynes et al. ................. 439/91 |
| 5,906,312 A | | 5/1999 | Zakel et al. |
| 5,958,590 A | | 9/1999 | Kang et al. |
| 6,043,150 A | * | 3/2000 | Downes et al. ............. 438/666 |
| 6,384,343 B1 | * | 5/2002 | Furusawa .................... 174/260 |
| 6,495,916 B1 | * | 12/2002 | Ohuchi et al. .............. 257/737 |
| 6,638,638 B2 | * | 10/2003 | Kim et al. ................... 428/546 |

FOREIGN PATENT DOCUMENTS

| | | |
|---|---|---|
| DE | 101 22 942 A1 | 5/2002 |
| DE | 101 57 205 A1 | 6/2003 |
| JP | 05-182973 | 7/1993 |
| JP | 05/259166 | 10/1993 |
| JP | 07-142488 | 6/1995 |
| JP | 09-205096 | 8/1997 |
| JP | 2000-164617 | 6/2000 |
| KR | 2001-0098699 | 11/2001 |

* cited by examiner

Primary Examiner—Jonathan Johnson
(74) Attorney, Agent, or Firm—Volentine Francos & Whitt, PLLC

(57) ABSTRACT

A solder bump structure includes a contact pad, an intermediate layer located over the contact pad, a solder bump located over the intermediate layer, and at least one metal projection extending upwardly from a surface of the intermediate layer and embedded within the solder bump. Any crack in the solder bump will tend to propagate horizontally through the bump material, and in this case, the metal projections act as obstacles to crack propagation. These obstacles have the effect of increasing the crack resistance, and further lengthen the propagation path of any crack as it travels through the solder bump material, thus decreasing the likelihood device failure.

14 Claims, 15 Drawing Sheets

SOLDER BUMP STRUCTURE AND METHOD FOR FORMING A SOLDER BUMP

BACKGROUND OF THE INVENTION

1. Field of the Invention

The present invention generally relates to integrated circuit (IC) chips and devices, and more particularly, the present invention relates to solder bump structures of IC chips and devices, and to methods of forming solder bump structures.

2. Description of the Related Art

As integrated circuits (IC's) advance toward higher speeds and larger pin counts, first-level interconnection techniques employing wire bonding technologies have approached or even reached their limits. New improved technologies for achieving fine-pitch wire bonding structures cannot keep pace with the demand resulting from increased IC chip processing speeds and higher IC chip pin counts. As such, the current trend is to replace wire bonding structures with other package structures, such as a flip chip packages and a wafer level packages (WLP).

Flip chip packages and WLP structures are partially characterized by the provision of solder bumps which connect to interconnection terminals of the IC chip. (Herein, unless otherwise specified, the term solder "bumps" is intended to encompass solder "balls" as well.) Device reliability is thus largely dependent on the structure and material of each solder bump and its effectiveness as an electrical interconnect.

A conventional solder bump structure will be described with reference to FIGS. 1 and 2, where like elements are designated by the same reference numbers. FIG. 1 shows the state of a flip chip package prior to mounting on a printed circuit board (PCB) substrate, and FIG. 2 shows the flip chip package mounted on the PCB substrate.

In FIGS. 1 and 2, an integrated circuit (IC) chip 1 is equipped with a chip pad 2, which is typically formed of aluminum. An opening is defined in one or more passivation layers 3 and 4 which expose a surface of the chip pad 2. Interposed between a solder bump 5 and the chip pad 2 are one or more under bump metallurgy (UBM) layers 6 and 7.

The UBM layers 6 and 7 functions to reliably secure the bump 5 to the chip pad 2, and to prevent moisture absorption into chip pad 2 and IC chip 1. Typically, the first UBM layer 6 functions as an adhesion layer and is deposited by sputtering of Cr, Ti, or TiW. Also typically, the second UBM layer 7 functions as a wetting layer and is deposited by sputtering of Cu, Ni, NiV. Optionally, a third oxidation protection layer of Au may be deposited as well.

Referring to FIG. 2, the solder bump 5 is mounted to a PCB pad 8 of a PCB substrate 9.

Mechanical stresses on the solder bump are a source of structural which can substantially impair device reliability. That is, when the chip heats up during use, both the chip and the PCB expand in size. Conversely, when the chip cools during an idle state, both the chip and the PCB substrate contract in size. The chip and the PCB substrate have mismatched coefficients of thermal expansion, and therefore expand and contract at different rates, thus placing mechanical stress on the intervening solder bump. FIG. 3 illustrates a number of examples in which stresses have caused fissures to be formed in the solder bumps. In this figure, reference number 2 denotes a chip pad, reference number 5 denotes the solder bump, reference number 8 denotes the PCB pad, and reference number 10 denotes a crack or fissure. The larger the crack, the more the interconnection becomes impaired, and device failures can occur when cracks propagate completely through the solder bump structure.

SUMMARY OF THE INVENTION

According to a first aspect of the present invention, a method for manufacturing a solder bump is provided, which includes forming at least one metal protrusion extending upwardly over a contact pad, and embedding the at least one metal protrusion in a solder material.

According to another aspect of the present invention, a method for manufacturing a solder bump is provided, which includes depositing an intermediate layer over a contact pad, forming a photoresist over a surface of the intermediate layer, patterning the photoresist to define at least one opening which partially exposes the surface of the intermediate layer, filling the at least one opening of the photoresist with a metal, removing the photoresist to expose the metal, wherein the metal forms at least one metal protrusion extending upwardly from the surface of the intermediate layer, and embedding the at least one metal protrusion in a solder material formed over the intermediate layer.

According to yet another aspect of the present invention, a method for manufacturing a solder bump is provided, with includes depositing an intermediate layer over a contact pad, forming a photoresist over a surface of the intermediate layer, patterning the photoresist to define at least one opening which partially exposes the surface of the intermediate layer, filling the at least one opening of the photoresist with a metal to a first depth, filling the at least one opening of the photoresist with a solder material to a second depth such that the solder material is stacked on the metal within each of the at least one opening, removing the photoresist to expose the metal and the first solder material, wherein the metal and first solder material form at least one protrusion extending upwardly from the surface of the intermediate layer, and reflowing the solder material to form a solder bump having the metal embedded therein.

According to still another aspect of the present invention, a method for manufacturing a solder bump is provided, which includes depositing an intermediate layer over a contact pad, forming a photoresist over a surface of the intermediate layer, patterning the photoresist to expose a solder bump region over the surface of the intermediate layer, growing at least one metal dendrite having a plurality of branches which project upwardly in the solder bump region from the surface of the intermediate layer, filling the solder bump region with a solder material so as to embed the at least one metal dendrite within the solder material, and removing the photoresist.

According to another aspect of the present invention, a solder bump structure is provided, which includes a contact pad, an intermediate layer located over the contact pad, a solder bump located over the intermediate layer, and at least one metal projection extending upwardly from a surface of the intermediate layer and embedded within the solder bump.

BRIEF DESCRIPTION OF THE DRAWINGS

The aspect and advantages of the present invention will become readily apparent from the detailed description that follows, with reference to the accompanying drawings, in which:

FIG. 4(b) a cross-sectional view along the line I–I' of FIG. 4a;

FIG. 7(b) is a cross-sectional view along the line II–II' of FIG. 7a; and

DETAILED DESCRIPTION OF THE PREFERRED EMBODIMENTS

The present invention is at least partially characterized by the inclusion of one or more metal projections within the solder bump material to form an obstacle which impedes the propagation of a crack within the solder bump material. While the metal projections can take any number of forms, the invention will be described below with reference to several preferred embodiments.

Figure 1:
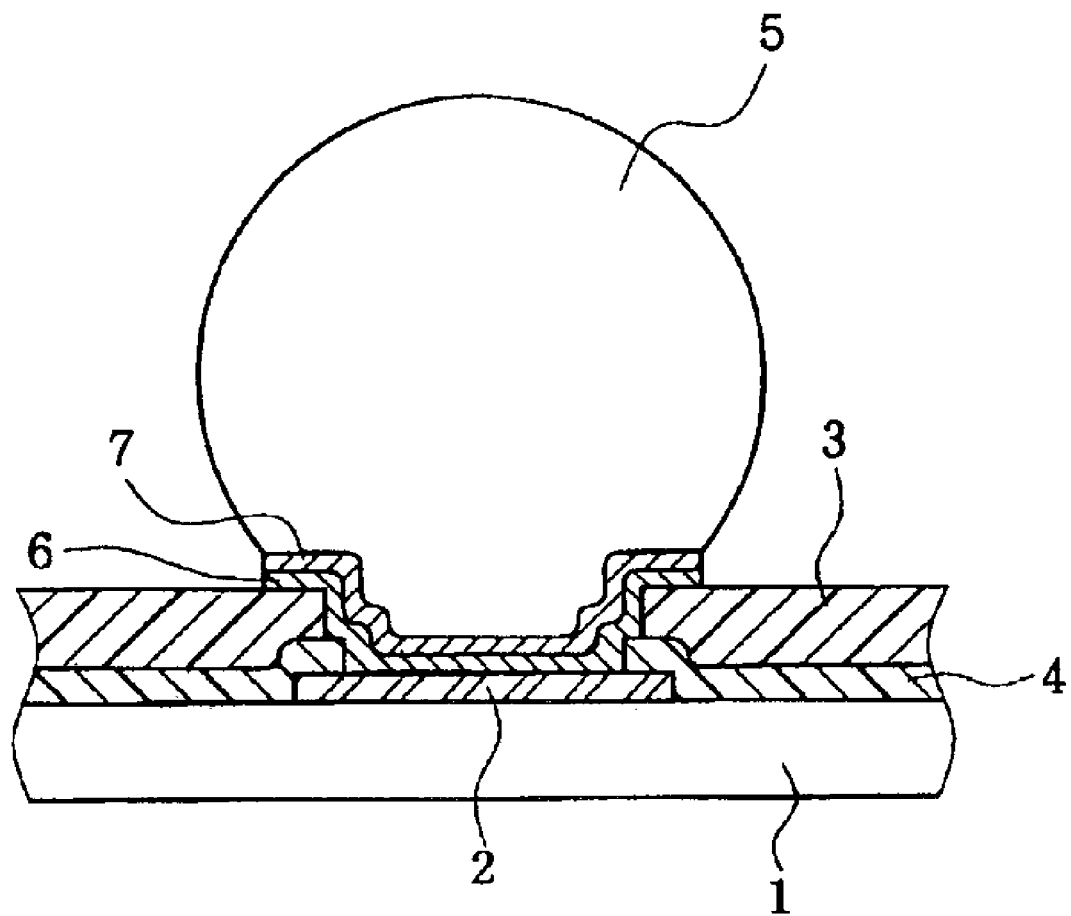
FIG. 1 illustrates a conventional flip-chip structure prior to mounting on a printed circuit board substrate.
Figure 2:
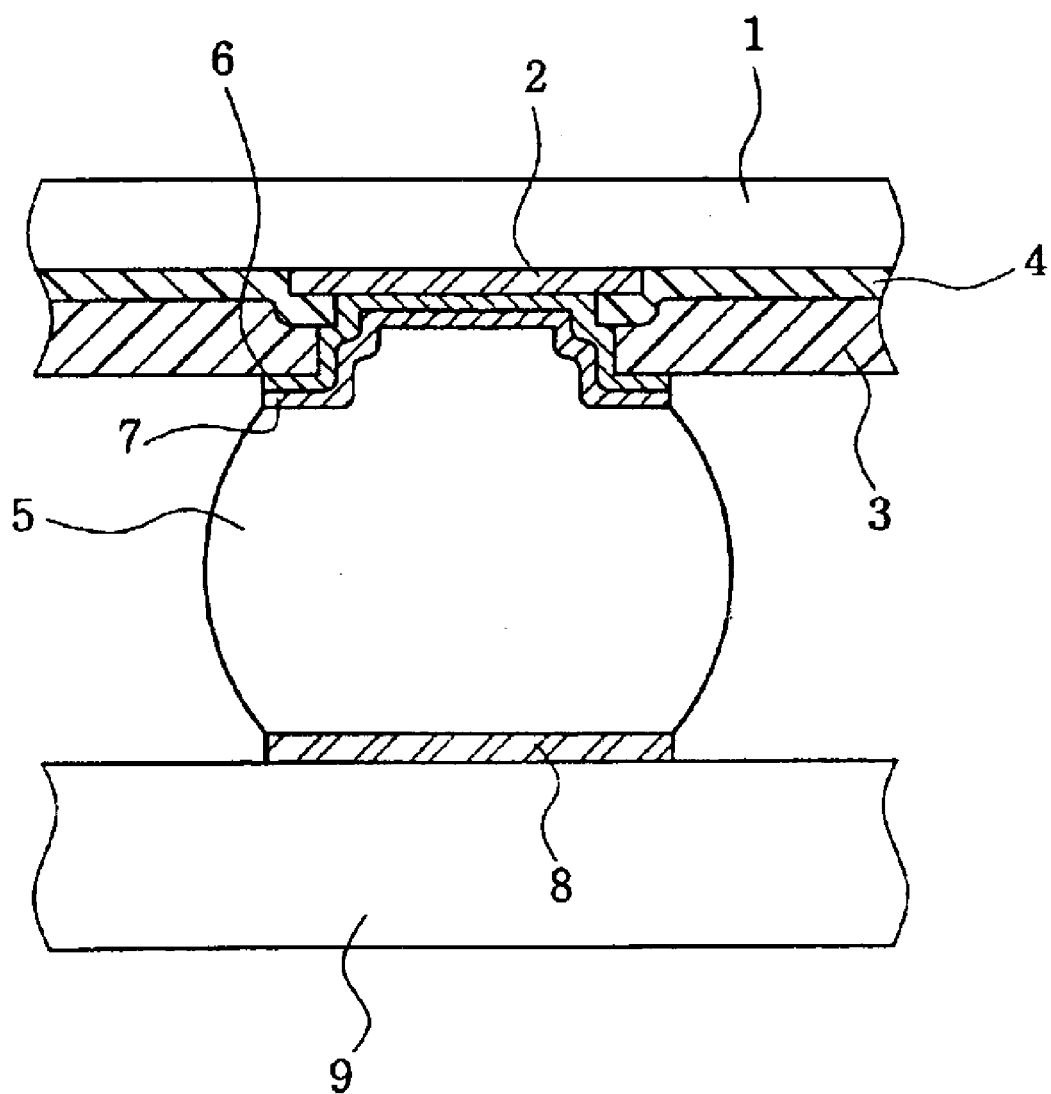
FIG. 2 illustrates a conventional flip-chip structure after mounting on a printed circuit board substrate.
Figure 3:
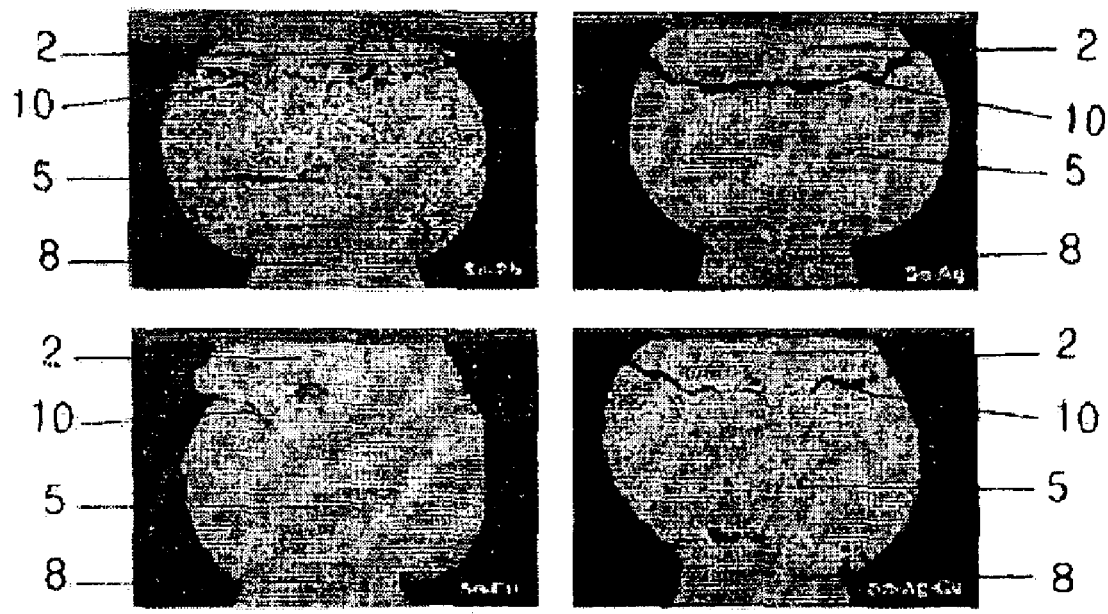
FIG. 3 contains photographs of conventional structures in which fissures have developed within the solder bumps thereof.
Figure 4A:
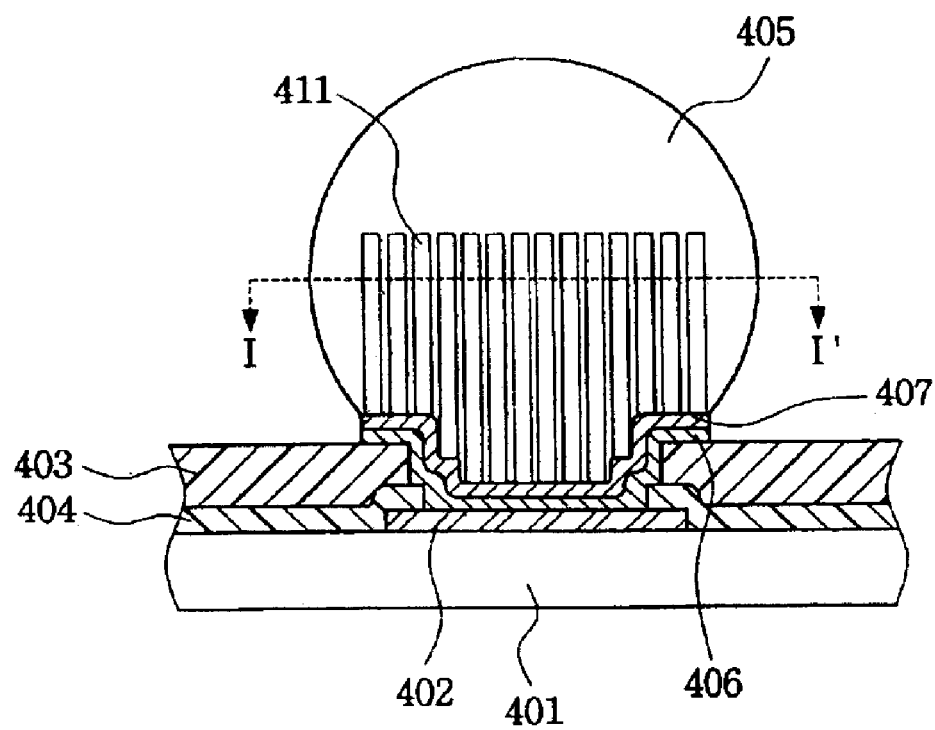
FIG. 4(a) is a cross-sectional view of a solder bump structure according to an embodiment of the present invention.
Figure 4B:
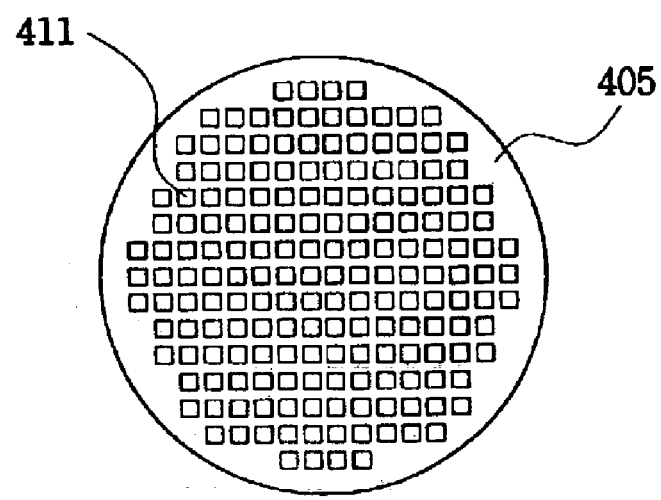

FIG. 4(a) is a cross-sectional view of a solder bump structure according to an embodiment of the present invention, and FIG. 4(b) a cross-sectional view along the line I–I' of FIG. 4(a). The solder bump structure includes a contact pad 402 of an electronic device such as an IC chip 401. Preferably, the IC chip 401 is contained a flip chip package or a wafer level package. An opening is defined in one or more passivation layers 403 and 404 which expose a surface of the chip pad 402. Interposed between a solder bump 405 and the chip pad 402 are one or more intermediate layers 406 and 407. The intermediate layers 406 and 407 may be under bump metallurgy (UBM) layers. For example, the layer 406 may be a UBM adhesion layer made of Cr, Ti or TiW, and the layer 407 may he a wetting layer made of Cu, Ni or NiV. Also, an additional oxidation protection layer of Au may be provided.

The solder bump 405 is located over the intermediate layer 407. An example of the solder bump dimensions is 100×100 μm, and examples of a material constituting the solder bump include Sn, Pb, Ni, Au, Ag, Cu, Bi and alloys thereof. In addition, at least one metal projection 411 extends upwardly from a surface of the intermediate layer 407 and is embedded within the solder bump 405. In this embodiment, as shown in FIGS. 4(a) and 4(b), a plurality of metal projections 411 extend upwardly from the surface of the intermediate layer 407 and are embedded within the solder bump 405. Preferably, because of reflow of the solder material during fabrication, a melting point of a material of the solder bump 405 is less than a melting point of the metal projections 411. An example of the width of each projection 411 is about 5 to 70 μm, and examples of the material constituting the metal projections 411 include Ni, Cu, Pd, Pt and alloys thereof.

As best shown in FIG. 4(b), a cross-section of the plurality of projections 411 defines a regular mesh pattern in a plane parallel to the contact pad 402. Generally, any crack in the solder bump will tend to propagate horizontally through the bump material, and accordingly, the regular mesh pattern of metal projections 411 act as obstacles to crack propagation. These obstacles have the effect of increasing the crack resistance, and further lengthen the propagation path of any crack as it travels through the solder bump material, thus decreasing the likelihood device failure.

Many other patterns of metal projections 411, both regular and irregular, may be adopted, such as off-set parallel rows of projections or concentric sets of patterns. In addition, the individual projections 411 may have cross-sections which differ from the generally square cross-sections of FIG. 4(b), such as elliptical cross-sections, polygonal cross-sections, and combinations thereof. Moreover, a single contiguous projection may be provided, for example in the shape of a spiral or zig-zag pattern. Finally, the invention is not limited to the columnar projections 411 having vertical sidewalls as illustrated in FIG. 4(a). For example, projections with oblique or notched sidewalls may be formed instead. Also, projections having non-regular geometric shapes may be provided, such the dendrite structures described in a later embodiment.

A method for manufacturing a solder bump structure according to an embodiment of the invention will now be described with reference to FIGS. 5(a) through 5(i). At FIG. 5(a), an opening is defined in one or more passivation layers 503 and 504 which exposes a surface of a chip pad 502, typically made of aluminum. At least one intermediate layer 506 and 507 is formed over the passivation layers 503 and 504 and over the exposed surface of the chip pad 502. The intermediate layers 506 and 507 may be under bump metallurgy (UBM) layers. For example, the layer 506 may be at UBM adhesion layer made of Cr, Ti or TiW, and the layer 50 may be a wetting layer made of Cu, Ni or NiV. Also, an additional protection oxidation layer of Au max be provided as well.

Figure 5A:
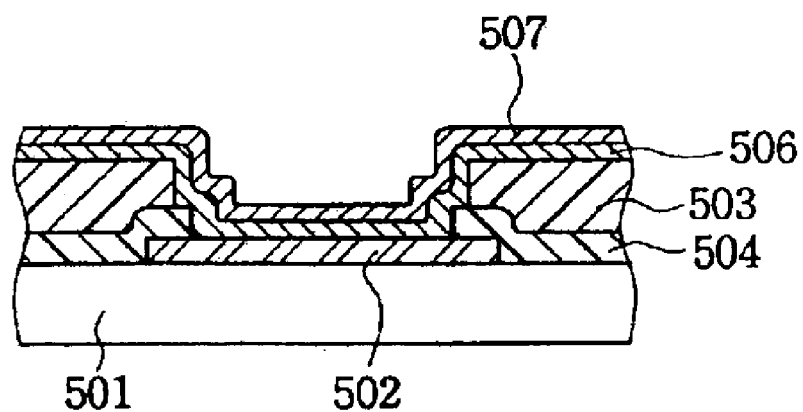
FIGS. 5(a) through 5(i) are cross-sectional views for use in describing a process for manufacturing a solder bump structure according to a preferred embodiment of the present invention.
Figure 5B:
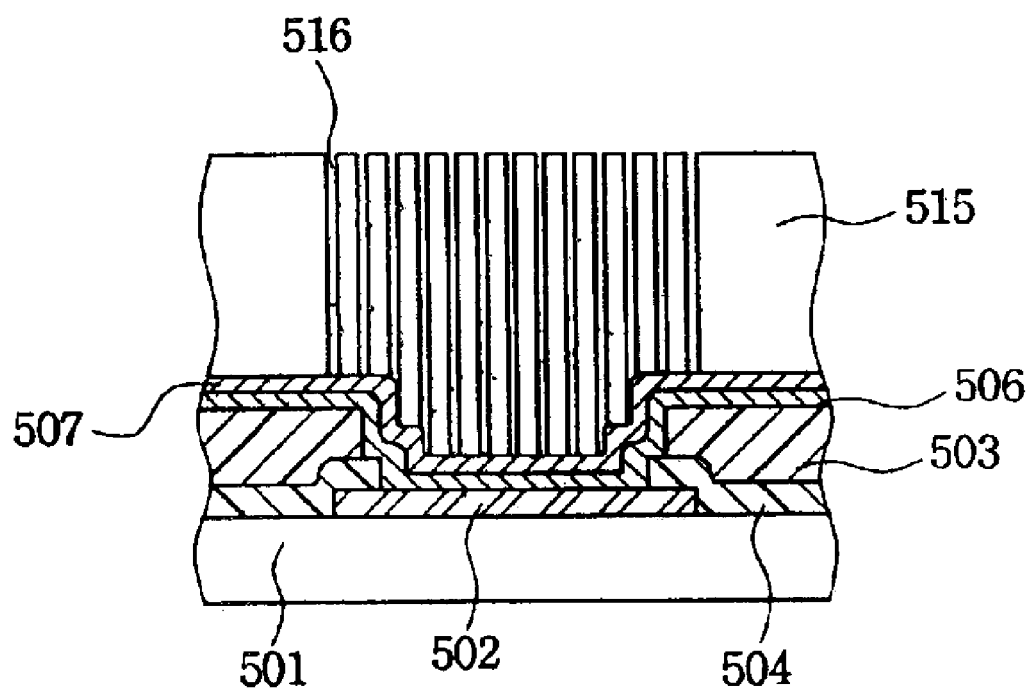

Next, at FIG. 5(b), a photoresist 515 is patterned over the intermediate layer 507 so as to expose one or more surface portions of the intermediate layer 507. In this embodiment, a plurality of openings 516 in the photoresist 515 have a cross-section which defines a mesh pattern in a plane parallel to the contact pad.

Figure 5C:
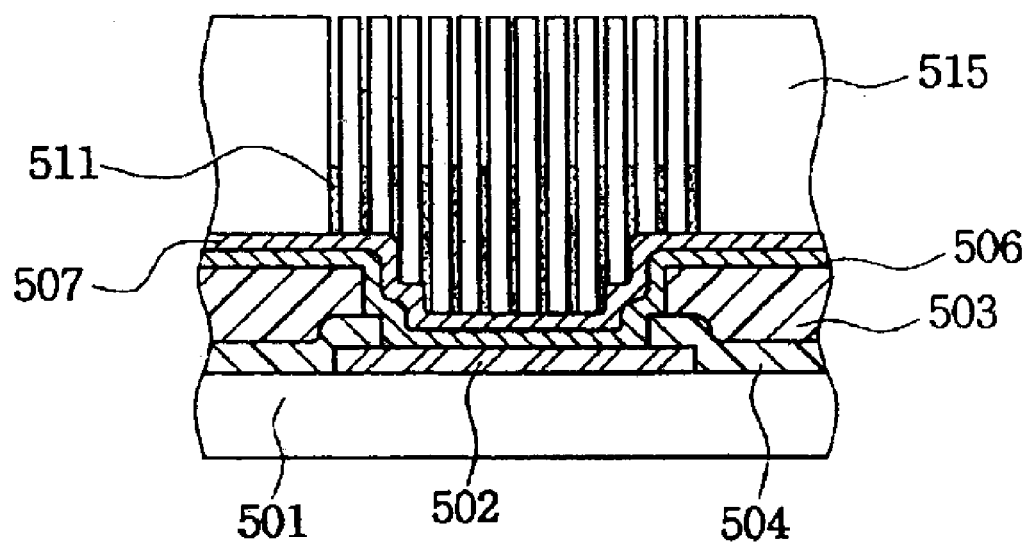
Figure 5D:
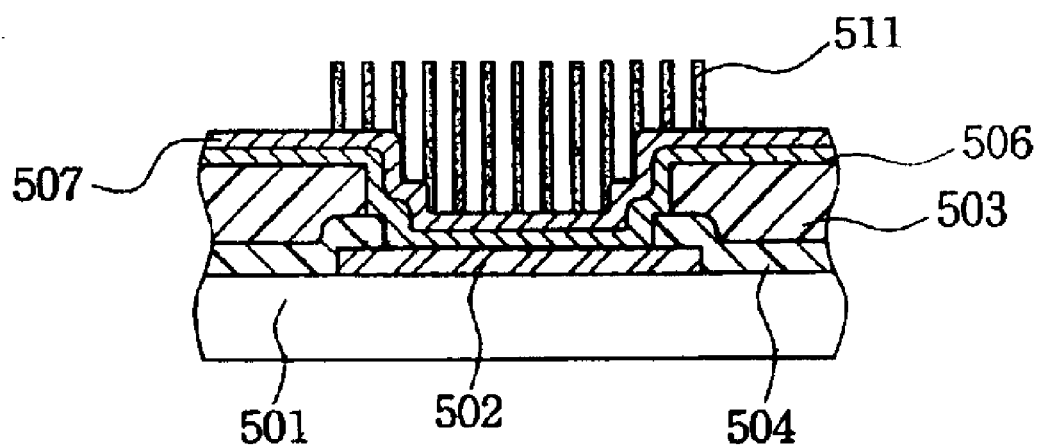

Then, at FIG. 5(c), a metal 511 is deposited, for example by electroplating, so as to fill the openings to a given height. Examples of the metal 511 include Ni, Cu, Pd, Pt and alloys thereof. The photoresist 515 is then removed, with the resultant structure having a plurality of metal projections 511 extending upward from the surface of the intermediate layer 507 as shown in FIG. 5(d).

Figure 5E:
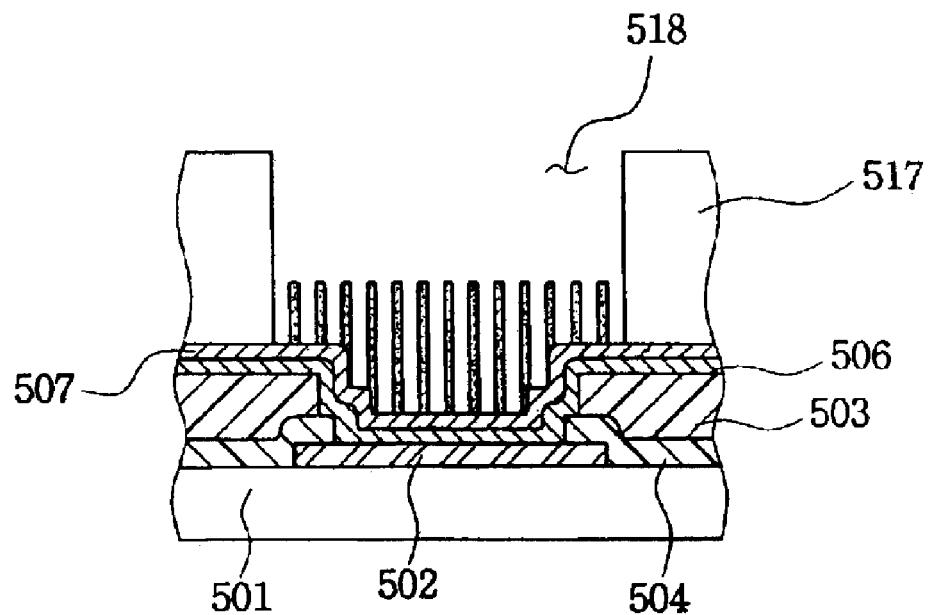
Figure 5F:
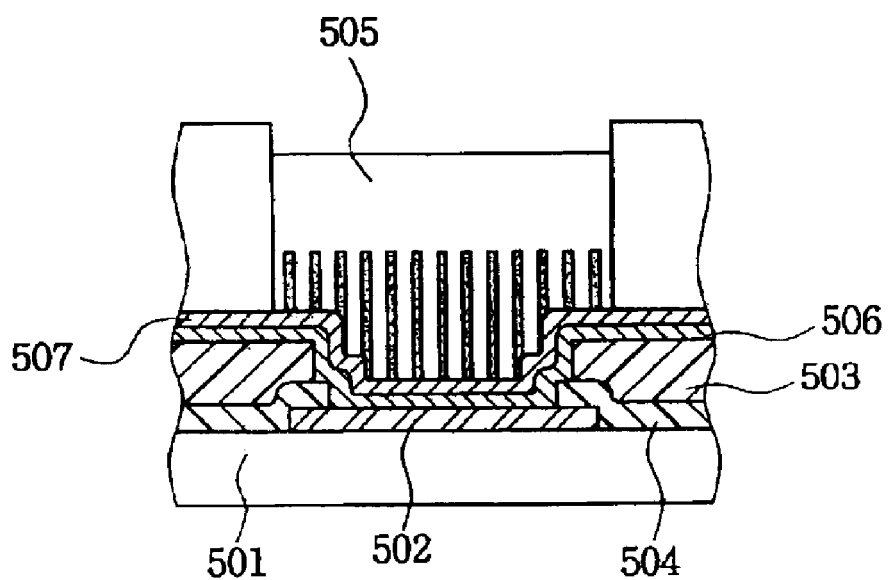
Figure 5G:
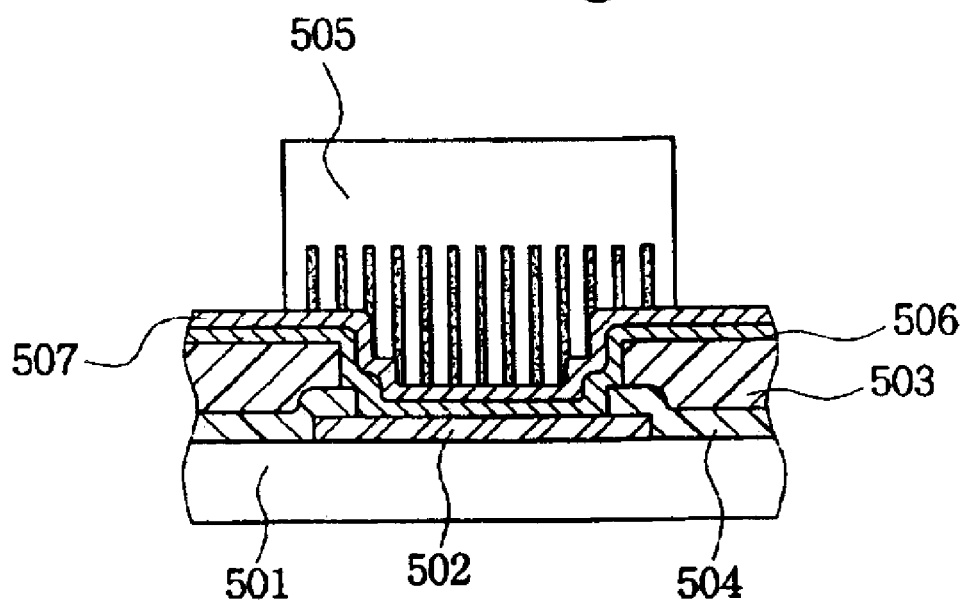

Next, as shown in FIG. 5(e), another photoresist 517 is patterned which has an opening 518 that exposes the intermediate layer 507 and the metal projections 511. The opening 518 defines a solder bump region. Then, at FIG. 5(f), a solder material 505 is deposited so as to fill the openings 518 to a given height. Examples of the solder material 505 include Sn, Pb, Ni, Au, Ag, Cu, Bi and alloys thereof. The photoresist 517 is then removed, with the resultant structure having the plurality of metal projections 511 extending upwardly from the surface of the intermediate layer 507 and embedded within the solder material 505 as shown in FIG. 5(g).

Figure 5H:
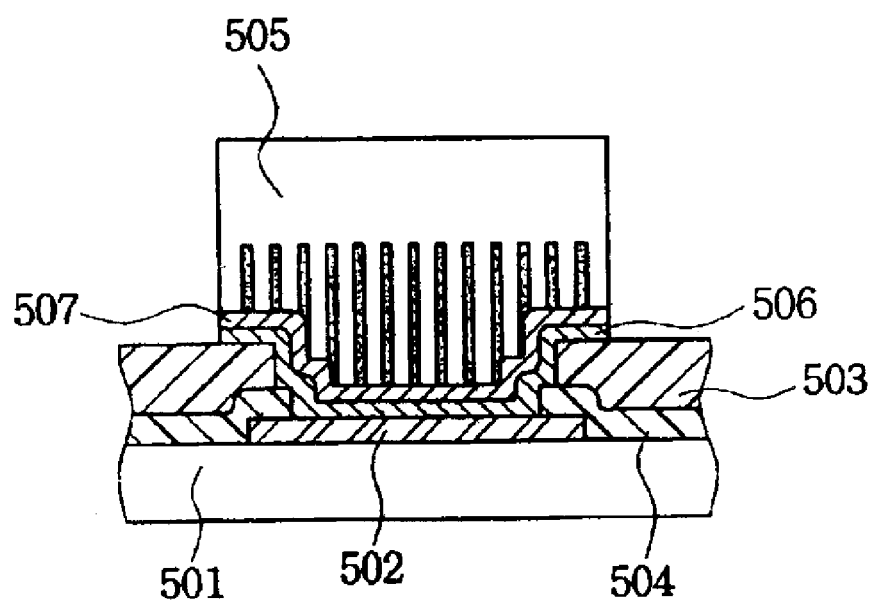
Figure 5I:
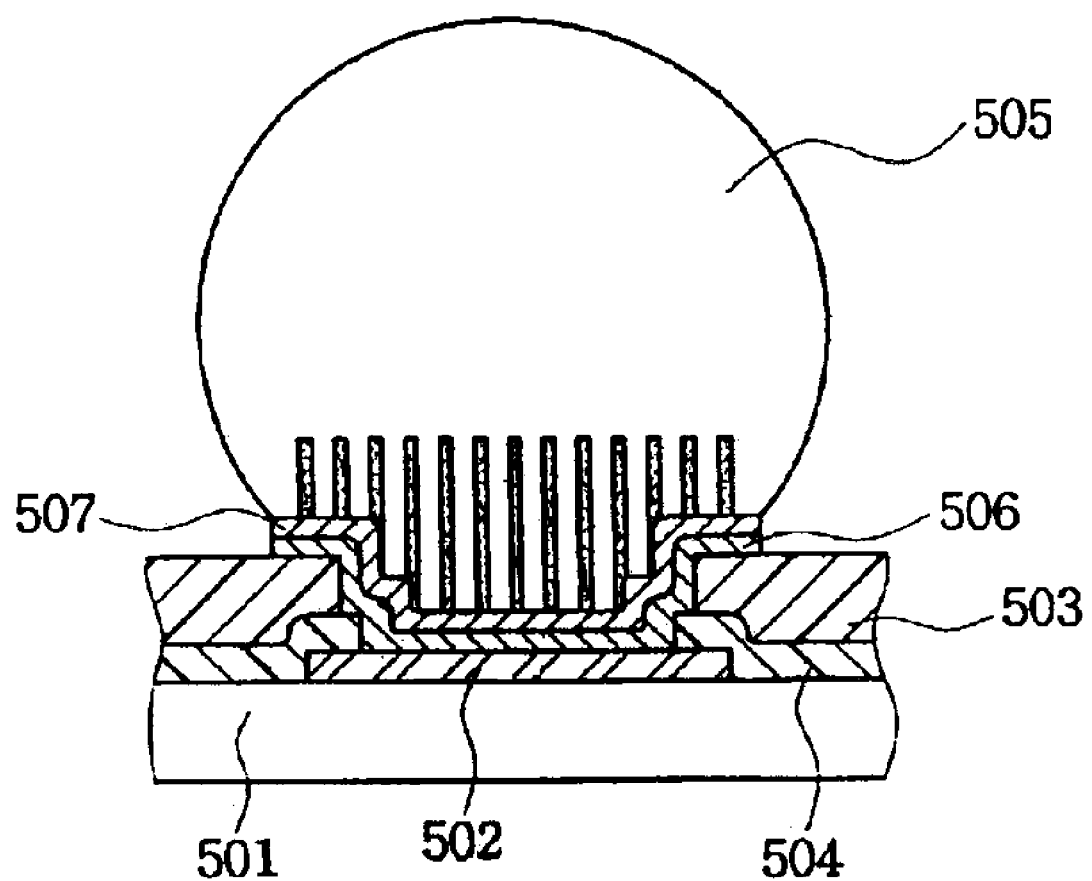

Then, at FIG. 5(h), using the solder material 505 as a mask, an etching process is conducted for the purpose of removing the intermediate (UBM) layers 506 and 507 outside a region of the solder bump structure. This etching is carried out in the case where the UBM layers extend continuously between adjacent solder bumps. Finally, at FIG. 5(i), the solder bump material 505 is heated at or above its melting point such that the solder bump material 505 is reflowed into a globe-shape configuration.

A method for manufacturing a solder bump structure according to another embodiment of the invention will now be described with reference to FIGS. 6(a) through 6(g). At FIG. 6(a), an opening is defined in one or more passivation layers 603 and 604 which exposes a surface of a chip pad 602, typically made of aluminum. At least one intermediate layer 606 and 607 is formed over the passivation layers 603 and 604 and over the exposed surface of the chip pad 602. The intermediate layers 606 and 607 may be under bump metallurgy (UBM) layers. For example, the layer 606 may be a UBM adhesion layer made of Cr, Ti or TiW, and the layer 607 may be a wetting layer made of Cu, Ni or NiV. Also, an additional protection oxidation layer of Au may be provided as well.

Figure 6A:
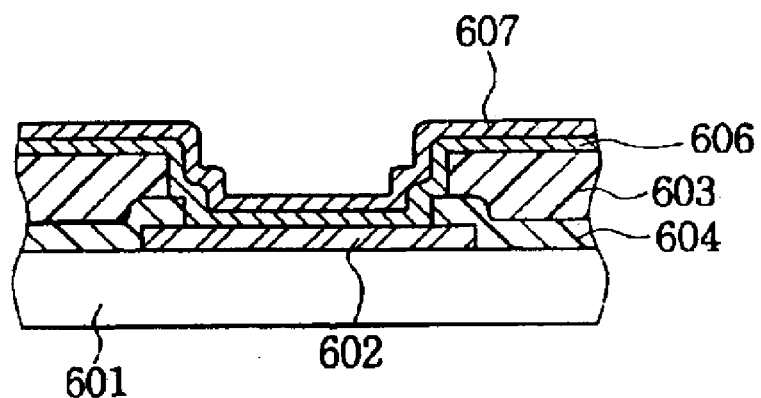
FIGS. 6(a) through 6(g) are cross-sectional views for use in describing a process for manufacturing a solder bump structure according to another embodiment of the present invention.
Figure 6B:
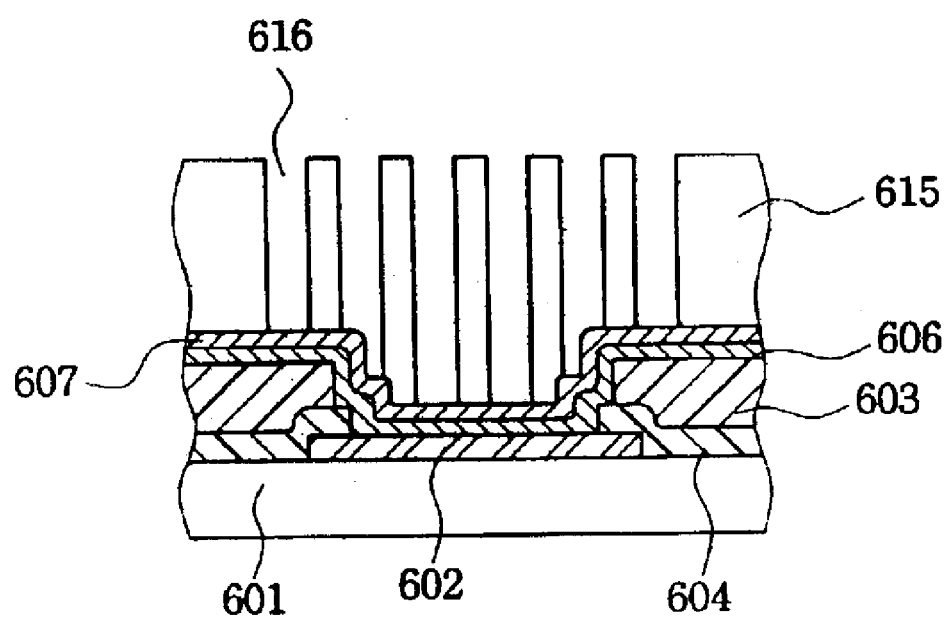

Next, at FIG. 6(b), a photoresist 615 is patterned over the intermediate layer 607 so as to expose one or more surface portions of the intermediate layer 607. In this embodiment, a plurality of openings 616 in the photoresist 615 have a cross-section which defines a mesh pattern in a plane parallel to the contact pad.

Figure 6C:
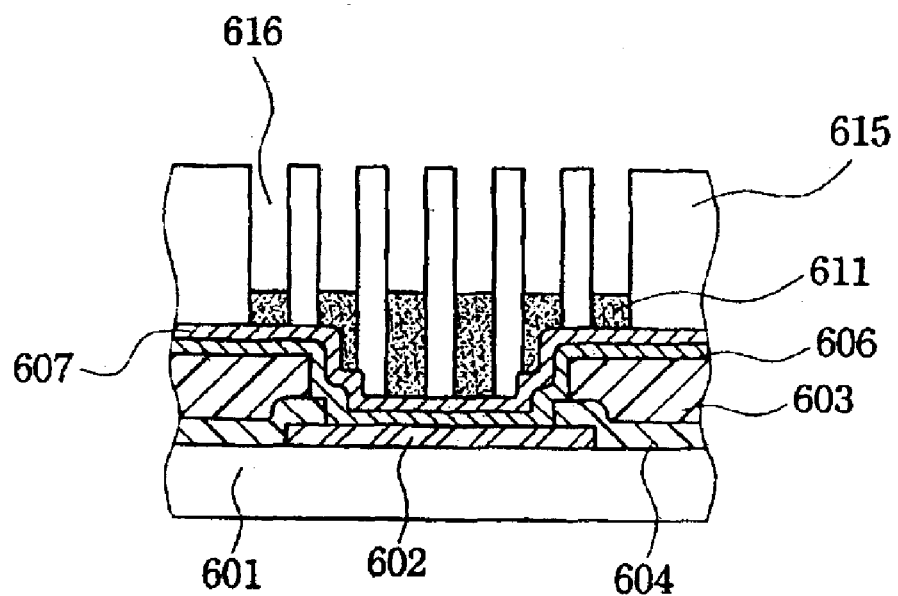

Then, at FIG. 6(c), a metal 611 is deposited, for example by electroplating, so as to fill the openings to a given height. Examples of the metal 611 include Ni, Cu, Pd, Pt and alloys thereof.

Figure 6D:
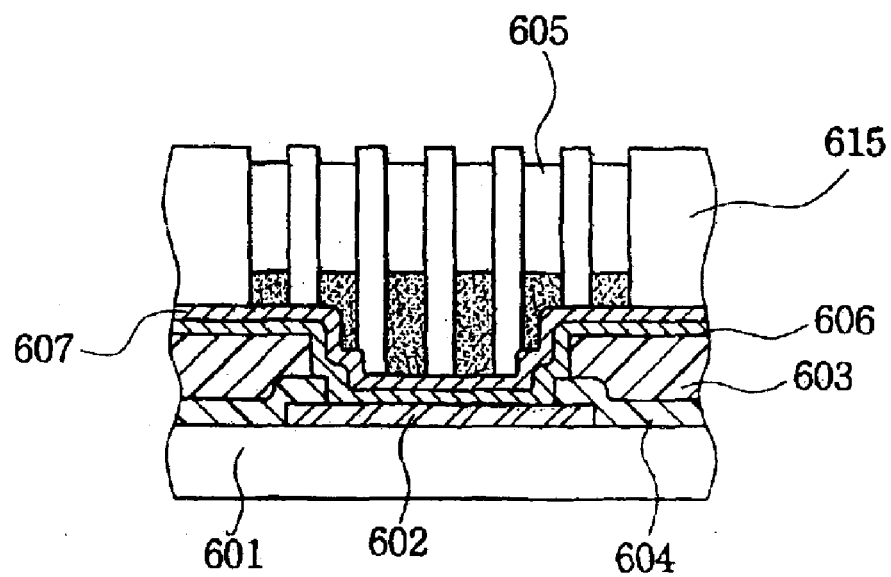
Figure 6E:
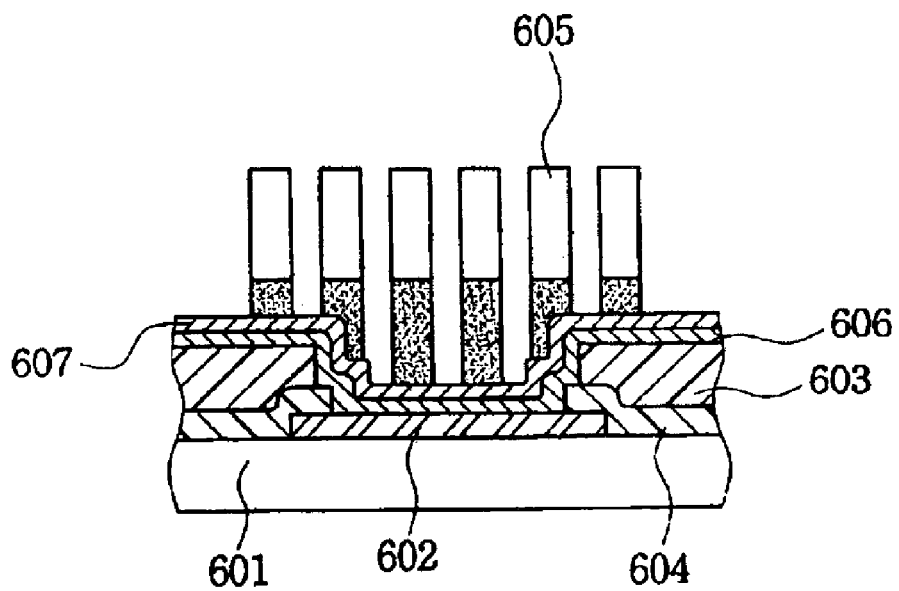

Next, at FIG. 6(d), a solder bump material 605 is deposited so as to fill the openings 616 in the photoresist. Examples of the solder material 605 include Sn, Pb, Ni, Au, Ag, Cu, Bi and alloys thereof. The photoresist 617 is then removed, with the resultant structure having a plurality of stacked structures, each of the stacked structures including a metal projection 611 and a portion of a the solder bump material 605 as shown in FIG. 6(e).

Figure 6F:
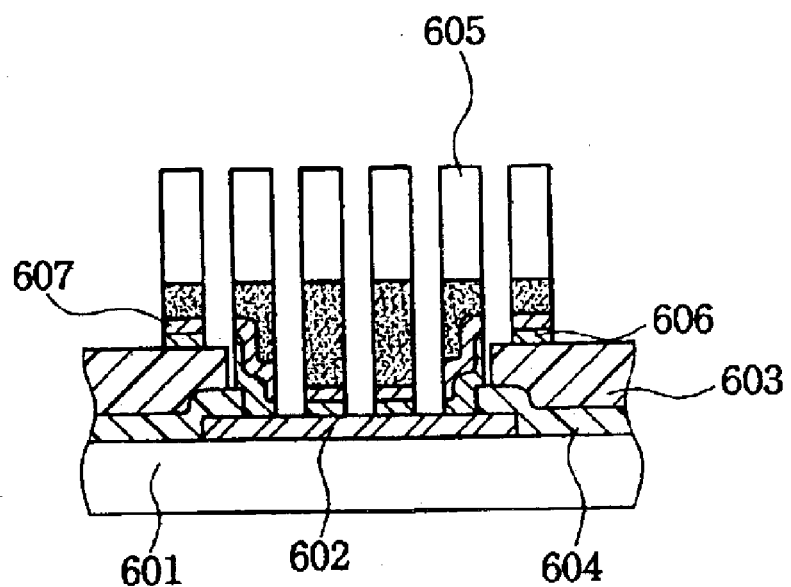
Figure 6G:
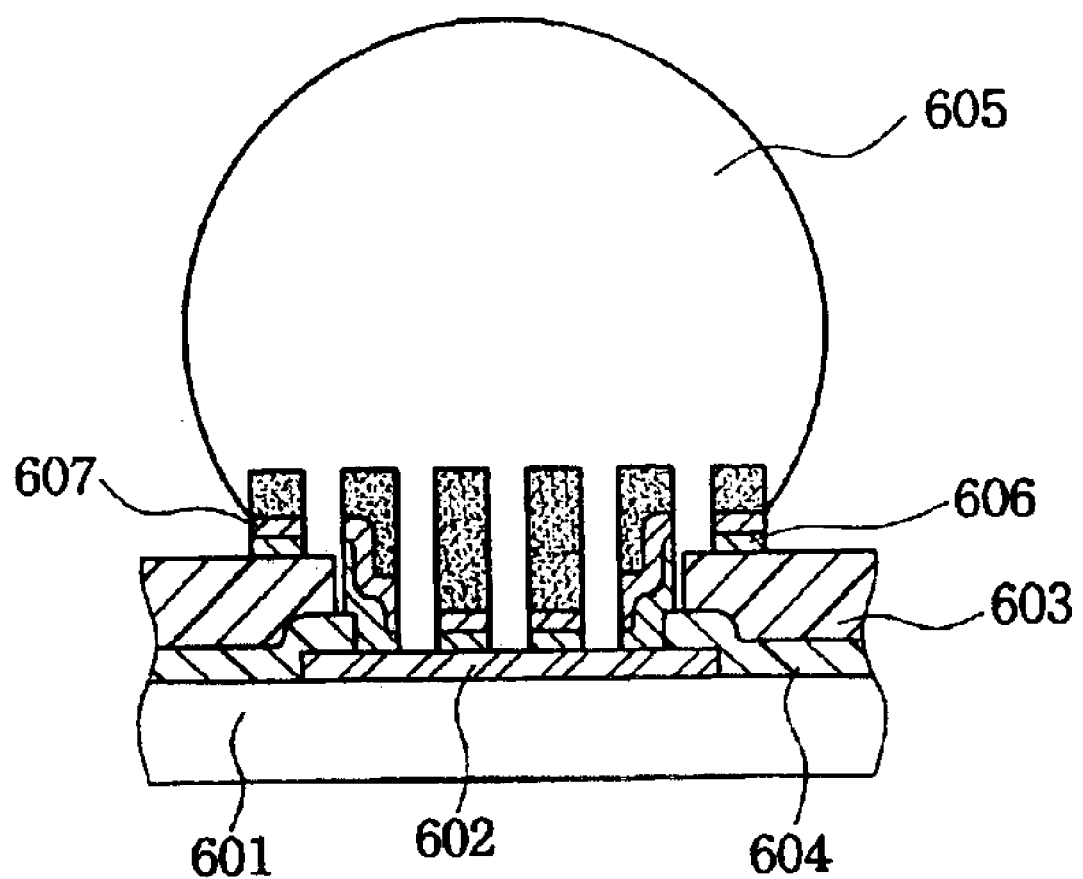
Figure 7A:
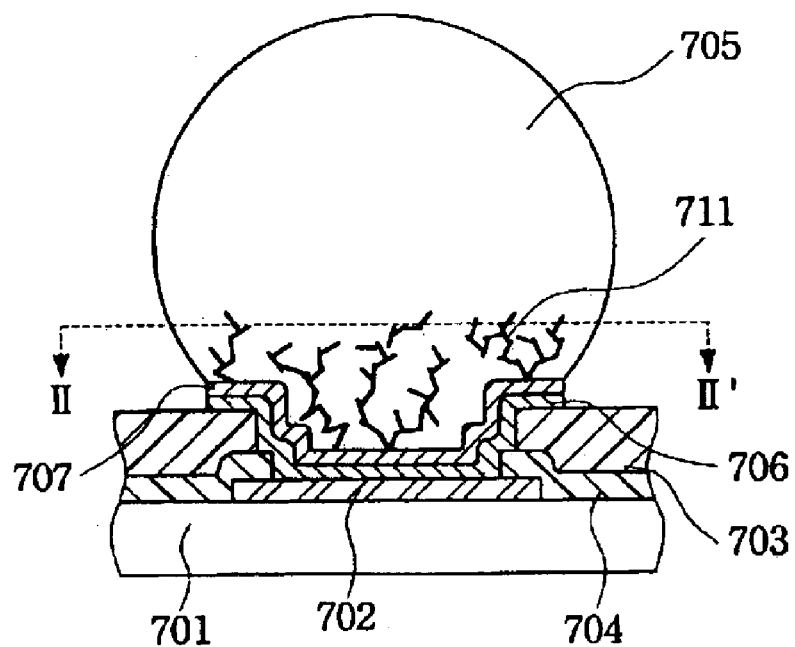
FIG. 7(a) is a cross-sectional view of a solder bump structure according to another embodiment of the present invention.
Figure 7B:
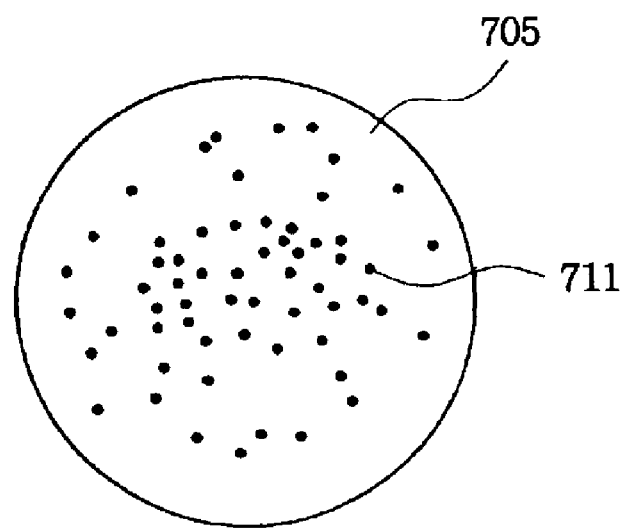

Then, at FIG. 6(f), using the solder bump material 605 and the metal projections 611 as a mask, an etching process is conducted for the purpose of removing the intermediate (UBM) layers 606 and 607 from outside the solder bump region and from between the stacked structures of the solder bump material 605 and the metal projections 611. This etching is carried out in the case where the UBM layers extend continuously between adjacent solder bumps. Finally, at FIG. 6(g), the solder bump material 605 is heated at or above its melting point such that the solder bump material 605 is reflowed into a globe-shape configuration.

Another embodiment of the present invention will now be described with reference to FIGS. 7(a), 7(b), 8(a) and 8(b). This embodiment is characterized by metal projections which are formed of dendrite structures instead of the columnar structures of the previous embodiments. In particular, after deposition of the intermediate (UBM) layers, a photoresist is patterned having an opening which exposes a bump region of the intermediate layers. Then dendrite crystal structures are grown within the bump region. In this regard, reference is made to U.S. Pat. No. 5,185,073, entitled "Method Of Fabricating Nendritic Materials", which is incorporated herein by reference, and which describes techniques which may be used to form a dendrite structure within the bump region according to the present invention. Examples of materials of the dendrite structure of the present embodiment include Ni, Cu, Pd, Pt and alloys thereof.

Figure 8A:
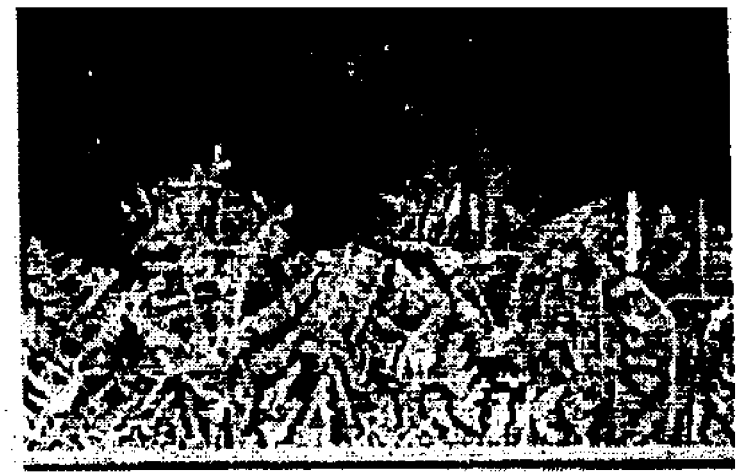
FIGS. 8(a) and 8(b) are cross-sectional views of solder bump structure having dendrite configuration embedded therein.
Figure 8B:
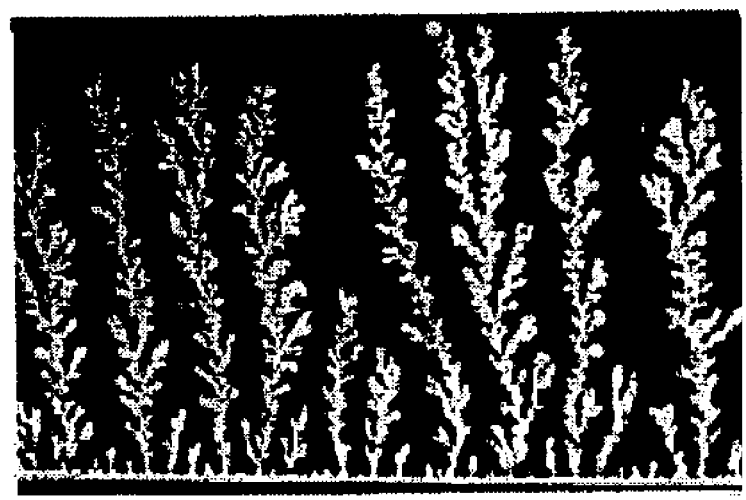

After formation of the dendrite structure, the bump region is filled with a solder material so as to embed the dendrite structure within the solder material. Then, the photoresist is removed, the intermediate (UBM) layers are etched outside the bump region, and the solder material is reflowed to obtain the structure illustrated in FIG. 7(a), and in FIG. 7(b) which a cross-sectional view along line II–II' in FIG. 7(a). In these figures, the solder bump structure includes a contact pad 702 of an electronic device such as an IC chip 701. An opening is defined in one or more passivation layers 703 and 704 which exposes a surface of the chip pad 702. Interposed between a solder bump 705 and the chip pad 702 are one or more intermediate layers 706 and 707, such as UBM layers. The solder bump 705 is located over the intermediate layer 707 and includes a metal dendrite structure 711 embedded therein. FIGS. 8(a) and 8(b) are photographs in a vertical cross-sectional plane of exemplary dendrite structures.

Any crack in the solder bump 705 will tend to propagate horizontally through the bump material, and in this case, the metal dendrite projections 711 act as obstacles to crack propagation. These obstacles have the effect of increasing the crack resistance, and further lengthen the propagation path of any crack as it travels through the solder bump material, thus decreasing the likelihood device failure.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A method for manufacturing a solder bump, comprising:

depositing an intermediate layer over a contact pad;

forming a first photoresist over a surface of the intermediate layer;

patterning the first photoresist to define at least one opening which partially exposes the surface of the intermediate layer;

filling the at least one opening of the first photoresist with a metal;

removing the first photoresist to expose the metal, wherein the metal forms at least one metal protrusion extending upwardly from the surface of the intermediate layer; and embedding the at least one metal protrusion in a solder material formed over the intermediate layer, wherein said embedding the at least one protrusion comprises forming a second photoresist which is patterned to expose a solder bump region over the intermediate layer and the at least one metal protrusion, filling the solder bump region with the solder material, removing the second photoresist, and reflowing the solder material.

2. The method as claimed in claim 1, wherein the first photoresist defines a plurality of openings, and wherein the metal forms a corresponding plurality of metal protrusions.

3. The method as claimed in claim 2, wherein a cross-section of the plurality of openings in the first photoresist defines a mesh pattern in a plane parallel to the contact pad.

4. The method as claimed in claim 1, wherein the intermediate layer is under bump metallurgy (UBM) comprised of a metal adhesion layer formed over the contact pad and a metal wetting layer formed over the metal adhesion layer.

5. The method as claimed in claim 4, wherein the UBM is further comprised of a metal oxidation protection layer formed over the metal wetting layer.

6. The method as claimed in claim 1, wherein the metal is selected from the group consisting of Ni, Cu, Pd, Pt or alloys thereof.

7. The method as claimed in claim 1, wherein the solder material is selected from the group consisting of Sn, Pb, Ni, Au, Ag, Cu, Bi or alloys thereof.

8. A method for manufacturing a solder bump, comprising:

depositing an intermediate layer over a contact pad;

forming a photoresist over a surface of the intermediate layer;

patterning the photoresist to define at least one opening which partially exposes the surface of the intermediate layer;

filling the at least one opening of the photoresist with a metal to a first depth;

filling the at least one opening of the photoresist with a solder material to a second depth such that the solder material is stacked on the metal within each of the at least one opening;

removing the photoresist to expose the metal and the first solder material, wherein the metal and first solder material form at least one protrusion extending upwardly from the surface of the intermediate layer; and reflowing the solder material to form a solder bump having the metal embedded therein.

9. The method as claimed in claim 8, wherein the photoresist defines a plurality of openings, and wherein the metal and the solder material form a corresponding plurality of protrusions when the photoresist is removed.

10. The method as claimed in claim 9, wherein a cross-section of the plurality of openings in the photoresist define a mesh pattern in a plane parallel to the contact pad.

11. The method as claimed in claim 8, wherein the intermediate layer is under bump metallurgy (UBM) comprised of a metal adhesion layer formed over the contact pad and a metal wetting layer formed over the metal adhesion layer.

12. The method as claimed in claim 11, wherein the UBM is further comprised of a metal oxidation protection layer formed over the metal wetting layer.

13. The method as claimed in claim 8, wherein the metal is selected from the group consisting of Ni, Cu, Pd, Pt or alloys thereof.

14. The method as claimed in claim 8, wherein the solder material is selected from the group consisting of Sn, Pb, Ni, Au, Ag, Cu, Bi or alloys thereof.

* * * * *